United States Patent [19]

Hiraki et al.

[11] 4,240,096
[45] Dec. 16, 1980

[54] FLUORINE-DOPED P TYPE SILICON

[75] Inventors: Shunichi Hiraki, Yokohama; Kuniaki Kumamaru, Kawasaki; Masaharu Aoyama, Yokohama; Toshio Yonezawa, Yokosuka, all of Japan

[73] Assignee: Tokyo Shibaura Denki Kabushiki Kaisha, Japan

[21] Appl. No.: 952,777

[22] Filed: Oct. 19, 1978

[30] Foreign Application Priority Data

Oct. 20, 1977 [JP] Japan ................ 52-125070

[51] Int. Cl.³ ........................... H01L 29/167
[52] U.S. Cl. ........................... 357/63; 357/48; 357/50; 357/51; 357/58
[58] Field of Search ........... 357/63, 64, 50, 58

[56] References Cited

U.S. PATENT DOCUMENTS 3,440,114 4/1969 Harper .................. 357/64

FOREIGN PATENT DOCUMENTS 7900776 10/1979 International (PCT) ........ 357/63

OTHER PUBLICATIONS

Kanamori et al., 23rd Japanese Applied Physics Meeting, Tokyo, No. 2 (1976), p. 131.

*Primary Examiner*—William D. Larkins
*Attorney, Agent, or Firm*—Finnegan, Henderson, Farabow, Garrett & Dunner

[57] ABSTRACT

A semiconductor device comprising a fluorine ion implantation region which is selectively formed in a semiconductor region and further activated. The fluorine ion implantation region is adapted for use as a high resistance layer or electrical isolation layer.

4 Claims, 10 Drawing Figures

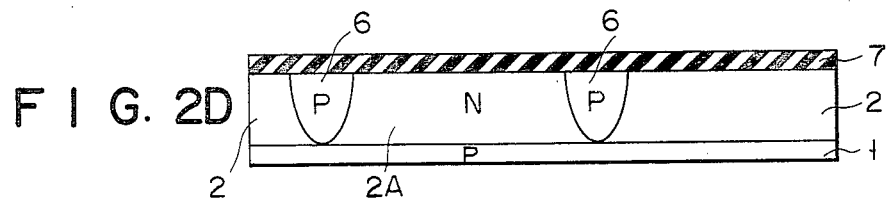
F I G. 2D
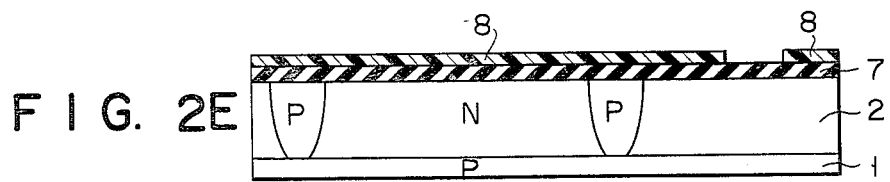
F I G. 2E
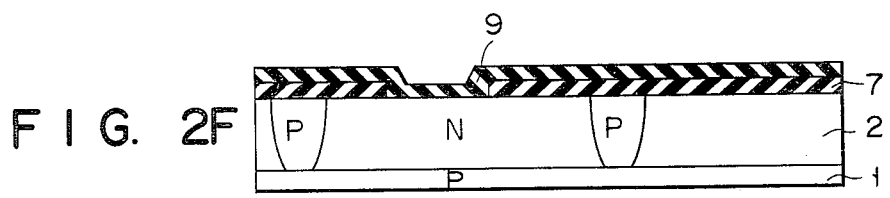
F I G. 2F
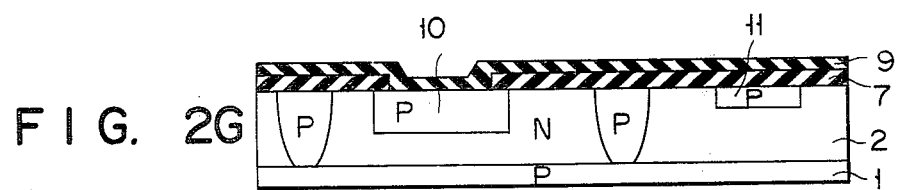
F I G. 2G
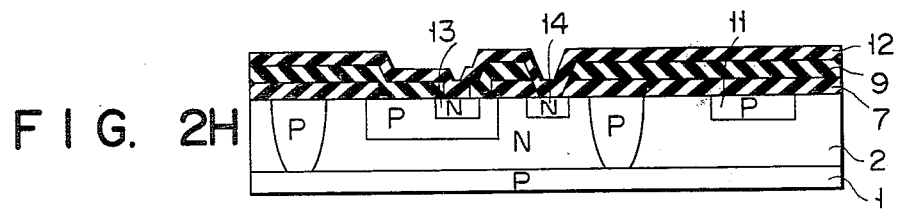
F I G. 2H
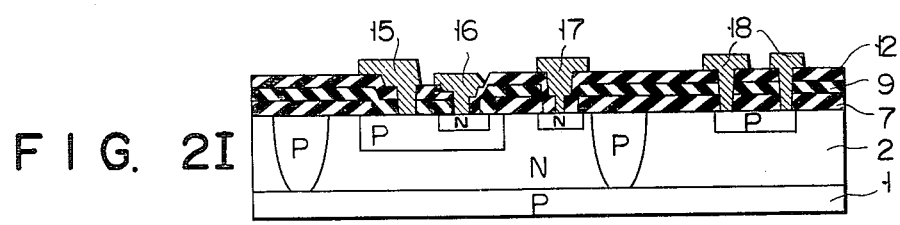
F I G. 2I

FLUORINE-DOPED P TYPE SILICON

BACKGROUND OF THE INVENTION

This invention relates to a semiconductor device comprising an isolation layer for electrically isolating constituent elements by means of a PN junction and/or a high resistance layer.

A passive element such as a high resistance layer or isolation layer for electrically isolating constituent elements by means of a PN junction is generally formed by any of the undermentioned processes.

(1) A first process runs as follows:

An N type layer is formed by epitaxial growth, for example, on a P type substrate. A thermally oxidized layer is mounted on the surface of the epitaxially grown N type layer. The oxidized layer is selectively etched with a photoresist used as an etching mask to form an opening. A boron silicate glass (BSG) layer is spread over the surface of the oxidized layer including the opening by the chemical vapor deposition method. Boron is thermally diffused as an impurity from the BSG layer in the aforesaid epitaxially grown N type layer through the opening.

(2) A second process is carried out by the following steps.

After the above-mentioned opening is formed, boron is diffused similarly as an impurity in the aforesaid epitaxially grown N type layer from, for example, a solid impurity source of boron nitride at a high temperature of 1100° to 1200° C., using a carrier gas.

(3) A third process comprises the steps of selectively forming the photoresist on the thermally oxidized layer, selectively implant boron in the aforesaid N type epitaxially grown layer by ion implantation through the thermally oxidized layer, followed by heat treatment of 1100° C. to 1200° C.

Where a high resistance layer is formed by the first or second process with the BSG layer or boron nitride layer used as a source of an impurity, then the sheet resistances of the plural high resistance layers formed in a given substrate including the epitaxially grown N type layer vary at as high a rate as ±15%. Further, the sheet resistances of the plural high resistance layers vary at the same high rate between the respective substrates. Therefore, it is very difficult to control the sheet resistances of the high resistance layers. With the third process applying the ion implantation of boron, the sheet resistances of the high resistance layers vary to a far smaller extent than in the first and second processes namely, by ½ to ⅓ of the above-mentioned extent of ±15%. Where, however, boron or gallium belonging to the III group of the periodic table or phosphorus or arsenic belonging to the V group of the periodic table is implanted by ion implantation, then the sheet resistance of a high resistance layer thus formed is limited within the range of 2000 $\Omega/\square$. It is difficult to cause a high resistance layer to maintain a higher resistance than this level, because considerable difficulties are encountered in controlling the degree of resistance based on the content of an impurity in the epitaxially grown high resistance layer.

SUMMARY OF THE INVENTION

It is accordingly the object of this invention to provide a semiconductor device which is free from drawback accompanying the prior art semiconductor device and comprises an improved high resistance layer and/or an isolation layer.

The semiconductor device of the invention comprises a fluorine ion implantation region which is selectively formed in a semiconductor region and further activated. Fluorine ions ($F^+$) are implanted in the selected portions of said semiconductor regions, followed by heat treatment. The implanted fluorine ions ($F^+$) are supposed to act as a carrier trap to extinguish carrier electrons. Therefore, the fluorine implantation region has a different rate of conductivity from the other portion of the semiconductor region than that in which said fluorine ion implantation region is formed. According to the present invention, the high resistance layer or isolation layer essentially consists of the above-mentioned fluorine implantation region. That portion of a semiconductor region in which fluorine ions ($F^+$) are implanted is preferred to be an N type region. The material of a mask used for selective implantation of fluorine ions includes an insulation substance such as silicon nitride or silicon oxide, a photoresist, and a metal such as aluminium, titanium, or chromium. The fluorine ions ($F^+$) may be implanted in a semiconductor region by the process of chemical vapor deposition, sputtering or plasma through an insulation layer such as a silicon oxide layer, silicon nitride layer or aluminium oxide layer. Or it is possible to implant the fluorine ions ($F^+$) directly in the exposed surface of the semiconductor region. A source of fluorine may consist of a gaseous fluoride such as boron fluoride or silicon fluoride or any other solid fluoride. The fluorine ions ($F^+$) are implanted in the prescribed region of the semiconductor while being accelerated by high voltage of 60 to 300 KV. Where the fluorine ions ($F^+$) are implanted in an N type silicon substrate at the rate of Q (number of implanted fluorine ions)$=5\times 10^{14} cm^{-2}$, then the fluorine ions ($F^+$) are distributed as shown in FIG. 1, with the energy of the implanted fluorine ions ($F^+$) taken as a parameter. The ordinate of FIG. 1 denotes the concentration ($cm^{-3}$) of fluorine ions ($F^+$), and the abscissa thereof shows the depth (Å) of a fluorine ion implantation region as measured from the exposed surface of a silicon layer. FIG. 1 shows that the point of a peak concentration of implanted fluorine ions ($F^+$) as measured from the exposed surface of the silicon layer can be freely varied by applying different levels of acceleration voltage.

BRIEF DESCRIPTION OF THE DRAWING

FIG. 2(A) to FIG. 2(I) show the sections of the various forms of a semiconductor device embodying this invention which correspond to the sequential manufacturing steps.

DESCRIPTION OF THE PREFERRED EMBODIMENTS

There will now be described a semiconductor device embodying this invention by reference to the sequential steps of manufacturing the same.

Figure 1:
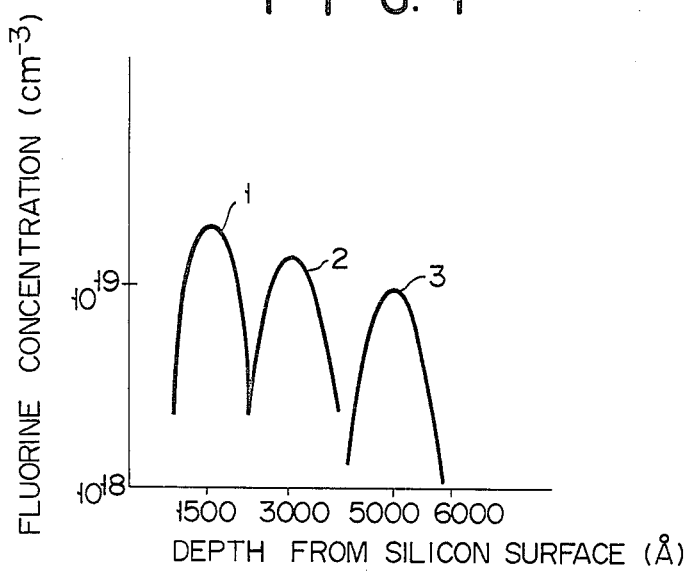
FIG. 1 graphically shows the distribution of fluorine ions ($F^+$) implanted in a silicon substrate with implantation energy taken as a parameter.
Figure 2A:
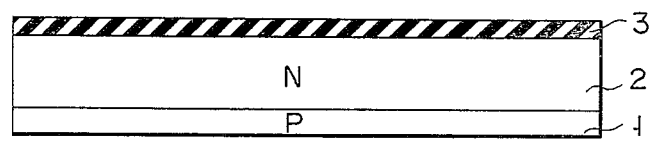
Figure 2B:
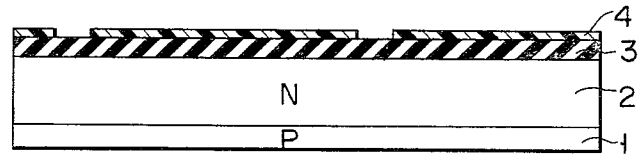
Figure 2C:
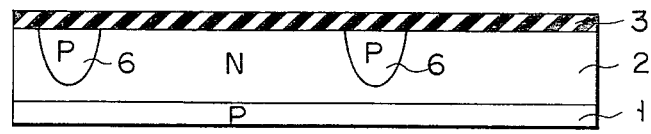

An N type layer 2 is formed on a P type silicon substrate 1 by epitaxial growth, followed by thermal oxidation. An oxide layer 3 is formed on said N type layer with a thickness of 1500Å (FIG. 2A). A photoresist 4 is selectively mounted on the oxide layer 3 with a thickness of 1.3 microns (FIG. 2B). Fluorine ions ($F^+$) are implanted in the epitaxially grown N type layer 2 through the oxide layer 3 from a fluorine ion source of boron fluoride with the photoresist 4 used as a mask at the dose rate of $5 \times 10^{14} cm^{-2}$, using acceleration voltage of 60 KV. The photoresist 4 is removed by a solution of sulfonic acid mixed with hydrogen peroxide in the ratio of 3:1. The whole mass is heat-treated about 5.5 for hours at 1200° C. in an atmosphere of nitrogen to provide a fluorine ion (F+) implantation region 6 (FIG. 2C) about 3.0 microns deep for the slumping diffusion of the fluorine ions (F+). The fluorine ions (F+) act as a carrier trap for extinguishing electrons contained in the epitaxially grown N type layer. Therefore, the fluorine ion implantation region 6 indicates the P conductivity type. The oxide layer 3 is taken off, and instead, a new thermally oxidized layer 7 is formed with a thickness of 4000Å (FIG. 2D). Under this condition, the slumping diffusion of fluorine ions (F+) goes deeper, causing the bottom of the fluorine implantation region 6 to reach the P type substrate 1. As the result, the fluorine implantation region 6 acts as a layer for electrically isolating from each other those portions 2A of the epitaxially grown N type layer 2 which lie adjacent to said fluorine implantation region 6.

A photoresist 8 is selectively formed with a thickness of 1.3 microns on the surface of a silicon oxide layer 7 spread over the epitaxially grown N type layer 2 (FIG. 2E). Fluorine ions (F+) are implanted in epitaxially grown N type layer 2 through the exposed surface of said silicon oxide layer 7 at the dose rate of $5 \times 10^{14} cm^{-2}$, applying acceleration voltage of 250 KV. The photoresist 8 is removed by a solution of sulfonic acid mixed with an aqueous solution of hydrogen peroxide in the ratio of 3:1. Further, the silicon oxide layer 7 is selectively taken off by photo-etching. The BSG layer 9 is continuously formed to cover the exposed surface of the epitaxially grown N type layer 2 and the silicon oxide layer 7 (FIG. 2F). When the mass is heat-treated for one hour at 1200° C. in an atmosphere of nitrogen, boron is diffused from the BSG layer 9 into the epitaxially grown N type layer 2 to provide a P type base region 10. At the same time, the slumping diffusion of fluorine ions (F+) proceeds to form a P type resistance layer 11 (FIG. 2G). The silicon oxide layer 7 and BSG layer 9 are selectively removed by photo-etching to provide openings. A layer 12 of phosphor-silicate glass (abbreviated as PSG) is continuously laid on the BSG layer 9 and the openings, the followed by heat-treatment at 1100° C. for diffusion of phosphorus in the epitaxially grown N type layer 2 to provide an emitter region 13 and collector region 14 (FIG. 2H). Last, as shown in FIG. 2I, a base electrode 15, emitter electrode 16, collector electrode 17 and resistance electrode 18 are formed by photo-etching and the customary electrode-forming process. Where fluorine ions (F+) are implanted through a thicker insulation layer, the point of the peak concentration of fluorine ions (F+) can be drawn nearer to the surface of a silicon layer.

The excellent effect of this invention will be more fully understood by reference to the following example.

The silicon oxide layer 7 was formed with a thickness of 1500Å. Fluorine ions (F+) were implanted at the dose rate of $5 \times 10^{14} cm^{-2}$, applying acceleration voltage of 60 KV. The mass was heat-treated for 5.5 hours at 1200° C. in an atmosphere of nitrogen mixed with oxygen for the slumping diffusion of fluorine ions (F+). As the result, a high resistance layer whose sheet resistance stood at $1.4 \times 10^4 \Omega/\square$ was provided in the substrate with variation in said sheet resistance defined within the range of ±3.6%.

What we claim is:

1. A semiconductor device comprising a fluorine ion implantation region which is selectively formed in an N type Group IV semiconductor body and further activated, said region thereby constituting a P type region.

2. The semiconductor device of claim 1, wherein said region is used as a high resistance layer.

3. The semiconductor device of claim 1, wherein said region is used as an electrical isolation layer.

4. The semiconductor device of claim 1, 2, or 3, wherein the Group IV semiconductor is silicon.

* * * * *